(12) United States Patent
Park et al.

(10) Patent No.: US 8,053,682 B2
(45) Date of Patent: Nov. 8, 2011

(54) MULTILAYER CERAMIC SUBSTRATE

(75) Inventors: Yun Hwi Park, Yongin (KR); Bong Gyun Kim, Suwon (KR); Yoon Hyuck Choi, Yongin (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 65 days.

(21) Appl. No.: 12/467,542

(22) Filed: May 18, 2009

(65) Prior Publication Data

US 2010/0055393 A1   Mar. 4, 2010

(30) Foreign Application Priority Data

Aug. 28, 2008   (KR) .................... 10-2008-0084726

(51) Int. Cl.
    *H05K 1/11*   (2006.01)
(52) U.S. Cl. ........ 174/264; 174/257; 174/265; 257/775; 428/210
(58) Field of Classification Search ................ 428/210; 174/264, 257, 265; 257/775
    See application file for complete search history.

(56) References Cited

U.S. PATENT DOCUMENTS

| | | | | |
|---|---|---|---|---|
| 3,077,511 | A * | 2/1963 | Bohrer et al. ................. | 174/265 |
| 5,028,473 | A * | 7/1991 | Vitriol et al. .................. | 428/137 |
| 5,139,851 | A * | 8/1992 | Acocella et al. .............. | 428/209 |
| 5,340,947 | A * | 8/1994 | Credle et al. ................. | 174/262 |
| 5,450,290 | A * | 9/1995 | Boyko et al. ................. | 361/792 |
| 5,496,619 | A * | 3/1996 | Itagaki et al. ................. | 428/209 |
| 5,576,518 | A * | 11/1996 | Shibuya et al. .............. | 174/264 |
| 5,717,247 | A * | 2/1998 | Koh et al. ...................... | 257/686 |
| 5,855,711 | A * | 1/1999 | Araki et al. ................. | 156/89.16 |
| 6,645,607 | B2 * | 11/2003 | Curcio et al. ................. | 428/209 |
| 6,790,305 | B2 * | 9/2004 | Curcio et al. ................. | 156/247 |
| 7,084,350 | B2 * | 8/2006 | De La Prieta et al. ........ | 174/169 |
| 7,749,592 | B2 * | 7/2010 | Nakamura et al. ............ | 428/210 |
| 2006/0000641 | A1 * | 1/2006 | Salama et al. ................ | 174/264 |

FOREIGN PATENT DOCUMENTS

| | | |
|---|---|---|
| JP | 2004-288915 | 10/2004 |
| KR | 10-2005-0036367 A | 4/2005 |
| KR | 10-2005-0091177 | 9/2005 |
| KR | 10-2006-0070930 | 6/2006 |

OTHER PUBLICATIONS

Korean Office Action, with English translation, issued in Korean Patent Application No. 10-2008-0084726, mailed May 11, 2010.

* cited by examiner

*Primary Examiner* — Cathy Lam
(74) *Attorney, Agent, or Firm* — McDermott Will & Emery LLP

(57) ABSTRACT

There is provided a multilayer ceramic substrate including a conductive via of a dual-layer structure capable of preventing loss in electrical conductivity and signal. The multilayer ceramic substrate includes: a plurality of dielectric layers; and a circuit pattern part formed on at least a portion of the dielectric layers, the circuit pattern part including at least one conductive via and conductive pattern, wherein the at least one conductive via comprises an outer peripheral portion and an inner peripheral portion, the outer peripheral portion formed along an inner wall of a via hole extending through the dielectric layers and formed of a first conductive material containing a metal, and the inner peripheral portion filled in the outer peripheral portion and formed of a second conductive material having a shrinkage initiation temperature higher than a shrinkage initiation temperature of the first conductive material.

4 Claims, 6 Drawing Sheets

MULTILAYER CERAMIC SUBSTRATE

CROSS-REFERENCE TO RELATED APPLICATIONS

This application claims the priority of Korean Patent Application No. 2008-084726 filed on Aug. 28, 2008, in the Korean Intellectual Property Office, the disclosure of which is incorporated herein by reference.

BACKGROUND OF THE INVENTION

1. Field of the Invention

The present invention relates to a multilayer ceramic substrate, and more particularly, to a multilayer ceramic substrate including a conductive via of a dual-layer structure capable of preventing loss in electrical conductivity and signal.

2. Description of the Related Art

A low temperature co-fired ceramics (LTCC) is highlighted as a packaging material of monolithic microwave integrated circuits (MMIC) in a radio frequency (mm wave) band of 30 GHz or more due to low dielectric loss and electrode loss. Also, a pure silver (Ag) paste is employed as an electrode material for wires to assure very low conductive loss. Moreover, a dielectric material has a loss coefficient of 0.2% for less which is at least 100 times lower than a printed circuit board (PCB), and thus exhibits superb characteristics in a radio frequency (mm wave) band.

However, a via connecting inter-layer wires should utilize an Ag electrode containing a great amount of glass in place of pure Ag to ensure matching of a sintering shrinkage ratio. Accordingly, this reduces electrical conductivity and attenuates an electrical signal to degrade characteristics of a final package.

In order to overcome this problem, studies have been vigorously conducted to match a sintering behavior of the Ag via electrode with LTCC chiefly by adding a minimum amount of predetermined additive to a pure metal. However, an effort to match the two materials without glass in a constrained sintering LTCC process has not been successful.

FIG. 1A is a graph illustrating a sintering shrinkage initiation period of pure Ag and LTCC according to the prior art. FIG. 1B is a horizontal cross-sectional view illustrating a via formed in a multilayer ceramic substrate according to the prior art. FIG. 1C is a graph illustrating a change in electrical conductivity of a via with respect to a higher content of glass in a via paste.

In a conventional manufacturing method of a multilayer ceramic substrate, a glass powder of 1 to 5 μm is mixed with an Ag powder of 2 to 3 μm to form a via paste for a constrained LTCC substrate and the via paste is filled in the via hole previously formed through metal mask printing. Several LTCC sheets each having the via filled are laminated into one and then sintered for 20 to 40 minutes at a temperature of 850-900° C. to produce a substrate.

Here, in a case where the paste for the via is formed of only pure Ag, as shown in FIG. 1A, there is a difference in a sintering shrinkage initiation period between an LTCC as indicated with A and Ag as indicated with B. Therefore, after sintering, as shown in C of FIG. 1B, voids or cracks occur on a wall of the via.

To prevent this, informing the via paste, a great amount of glass is added to the Ag powder to ensure matching of the sintering shrinkage initiation period with the LTCC. This via paste allows a via to be free from voids or cracks, after sintering.

However, as shown in FIG. 1C, an increased content of glass leads to poorer electrical conductivity than in a case where the via is formed by using pure Ag. That is, as for the via paste having glass added thereto, the via has electrical conductivity that is much lower than pure Ag via due to the glass with very low electrical conductivity. Accordingly, an increased amount of glass added to ensure matching of the sintering shrinkage initiation period with the LTCC results in lower electrical conductivity than in a case where pure Ag is employed.

SUMMARY OF THE INVENTION

An aspect of the present invention provides a multilayer ceramic substrate having a conductive via of a dual-layer structure capable of reducing signal loss in a radio frequency (mm) band.

According to an aspect of the present invention, there is provided a multilayer ceramic substrate including: a plurality of dielectric layers; and a circuit pattern part formed on at least a portion of the dielectric layers, the circuit pattern part including at least one conductive via and conductive pattern, wherein the at least one conductive via includes an outer peripheral portion and an inner peripheral portion, the outer peripheral portion formed along an inner wall of a via hole extending through the dielectric layers and formed of a first conductive material containing a metal, and the inner peripheral portion filled in the outer peripheral portion and formed of a second conductive material having a shrinkage initiation temperature higher than a shrinkage initiation temperature of the first conductive material.

The first conductive material may be Ag metal. The second conductive material may have a shrinkage initiation temperature equal to or higher than a shrinkage initiation temperature of the dielectric layers.

The second conductive material may have a higher content of silicon oxide ($SiO_2$) than the first conductive material. The second conductive material may have a higher content of glass than the first conductive material.

The outer peripheral portion may have a thickness that is 10% or less with respect to an entire radius of the conductive via. The outer peripheral portion may have a thickness that is 0.5% or more with respect to an entire radius of the conductive via.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
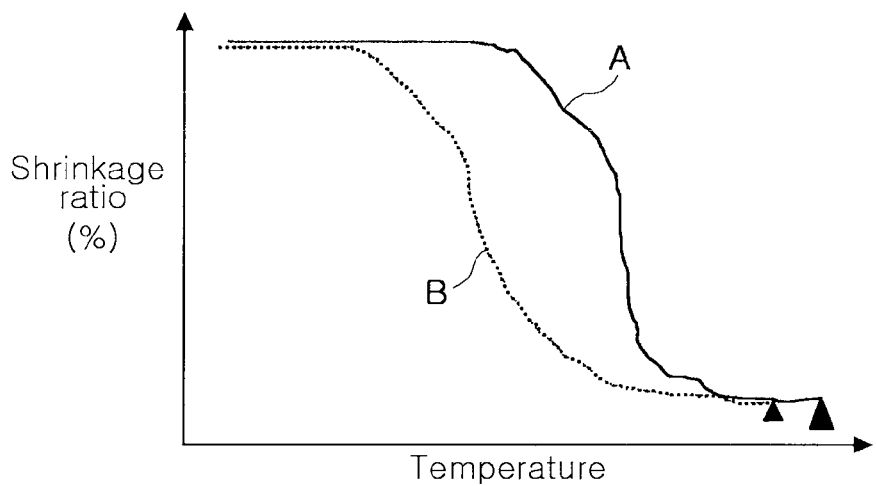
FIG. 1A is a graph illustrating a sintering shrinkage initiation period of pure Ag and LTCC according to the prior art.
Figure 1B:
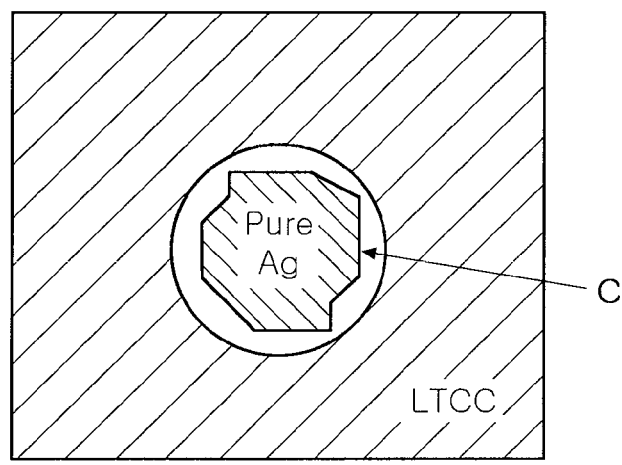
FIG. 1B is a horizontal cross-sectional view illustrating a via formed in a multilayer ceramic substrate according to the prior art.
Figure 1C:
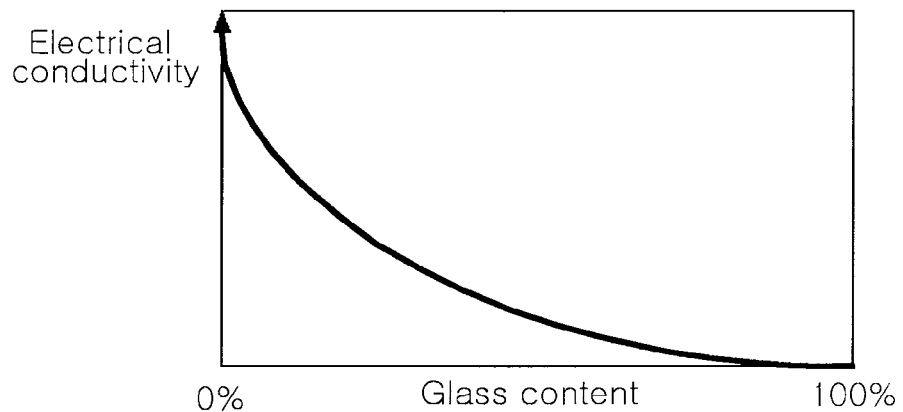
FIG. 1C is a graph illustrating a change in electrical conductivity of a via with respect to a greater content of glass in a via paste.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2A:
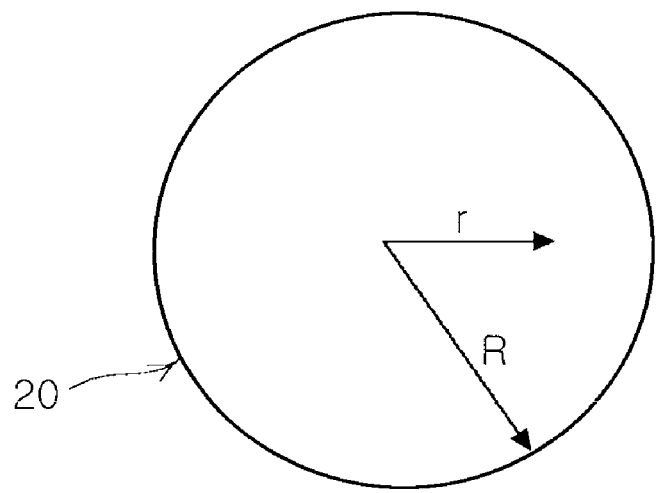
FIG. 2A is a horizontal cross-sectional view of a via.
Figure 2B:
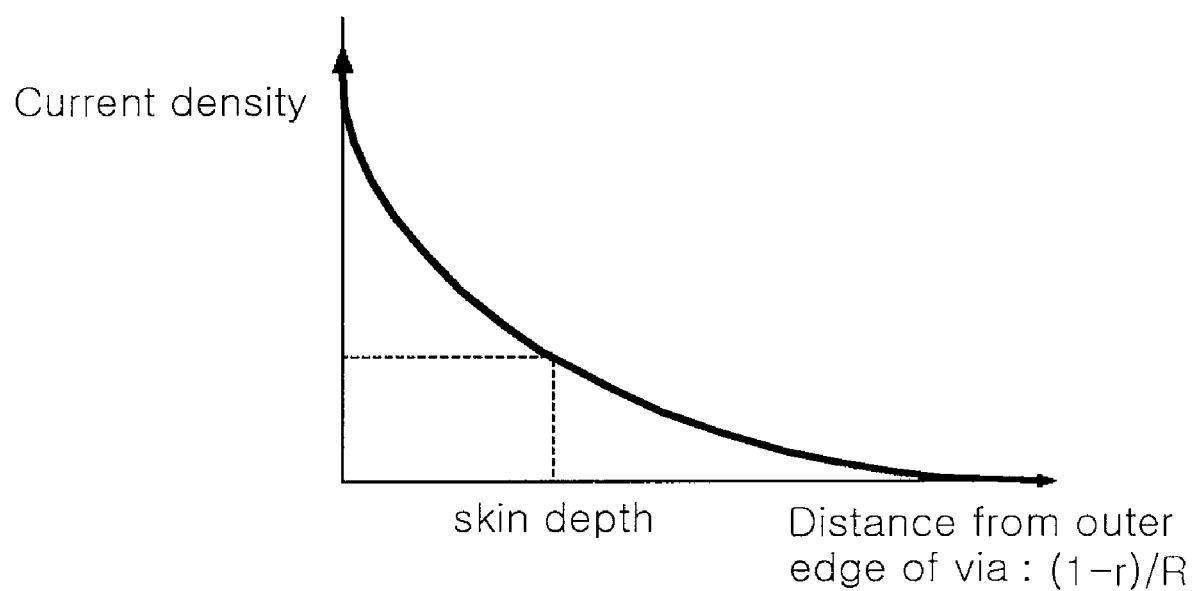
FIG. 2B is a graph illustrating a relationship between a distance from an outer edge of a via and density of a current flowing in the via.

FIG. 2A is a horizontal cross-sectional view of a via. FIG. 2B is a graph illustrating a relationship between a distance from an outer edge of a via and density of a current flowing in the via.

As shown in FIGS. 2A and 2B, a current density is varied by a distance from an outer edge of a via 20 according to Equation $$\frac{(1-r)}{R},$$

where r is a predetermined radius from a center of a via to a radius of the via, and R is a radius of the via. This is because an effective area of the via 20 where a current flows is defined as a skin depth. Here, according to a skin effect, with a higher frequency of a signal, more current is crowded toward a surface of a conductor and a depth where the current flows is termed a skin depth. That is, current flows only on a surface with a very small thickness in a radio frequency band.

As shown in FIG. 2B, with a smaller distance from the outer edge of the via, that is, a greater radius r from a center of the via 20, current flowing in the via 20 is increased in density with respect to the skin depth.

On the other hand, with a greater distance from the outer edge of the via, that is, a smaller radius r from the center of the via 20, current flowing in the via 20 is reduced in density with respect to the skin depth. Particularly, the skin depth is significantly reduced to 0.5 μm or less in a radio frequency (mm wave) band. This causes little current to flow inside the via to thereby reduce electrical conductivity of the via. Therefore, a decline in electrical conductivity of the via leads to loss in a radio frequency (RF) signal.

Therefore, the multilayer ceramic substrate of the present embodiment includes a conductive via of a dual-layer structure capable of preventing decline in electrical conductivity by forming a high-purity Ag layer in a skin depth area where current is crowded, in view of the skin depth in a radio frequency band.

Figure 3:
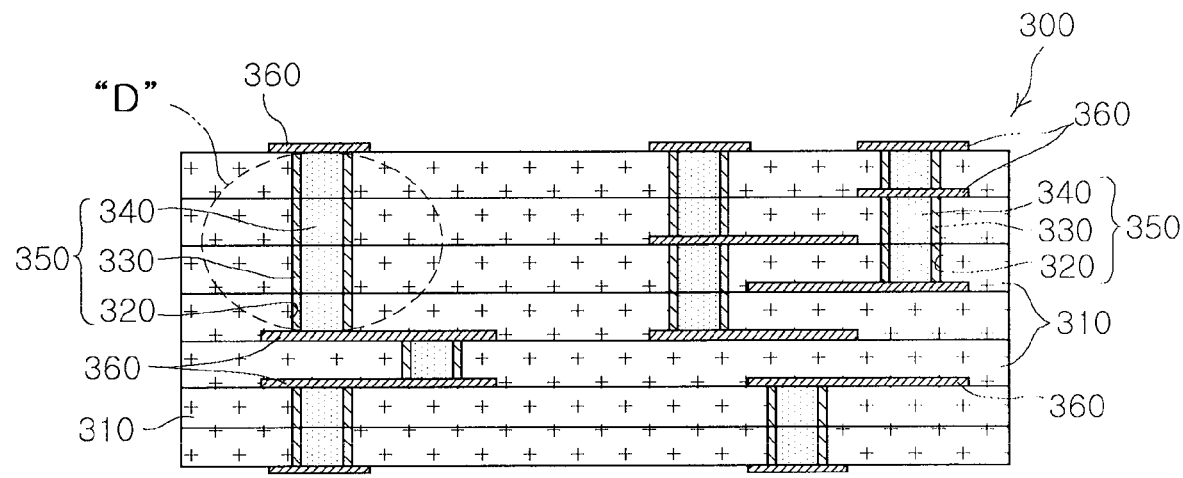
FIG. 3 is a vertical cross-sectional view illustrating a multilayer ceramic substrate having a conductive via of a dual-layer structure according to an exemplary embodiment of the invention.

FIG. 3 is a vertical cross-sectional view illustrating a multilayer ceramic substrate having a conductive via of a dual-layer structure according to an exemplary embodiment of the invention. As shown in FIG. 3, the multilayer ceramic substrate 300 of the present embodiment includes a plurality of dielectric layers 310, and a plurality of conductive vias 350 and conductive patterns 360 formed on at least a portion of the dielectric layers 310.

The plurality of dielectric layers may be made of a low-temperature co-fired ceramics (LTCC). The dielectric layers have a shrinkage initiation temperature of 850 to 950° C. during sintering. The dielectric layers include a circuit pattern part formed of the conductive vias 350 and the conductive patterns 360.

At least one of the conductive vias 350 is formed along an inner wall 320 of a via hole extending through the dielectric layers. The at least one conductive via 350 includes an outer peripheral portion 330 formed of a first conductive material containing a metal and an inner peripheral portion 340 filled in the outer peripheral portion 330 and formed of a second conductive material having a shrinkage initiation temperature higher than a shrinkage initiation temperature of the first conductive material. Here, the first conductive material may be a metal with high electrical conductivity, and particularly may be Ag metal. Also, the first conductive material is Ag metal with a small amount additive added thereto, but is substantially high-purity Ag.

The second conductive material is formed of a material having a shrinkage initiation temperature equivalent to or higher than a shrinkage initiation temperature of the dielectric layers. That is, the second conductive material has a higher content of glass or silicon oxide ($SiO_2$) than the first conductive material. Accordingly, the inner peripheral portion 340 is formed of a second conductive material having a shrinkage initiation temperature equivalent to or higher than a shrinkage initiation temperature of the dielectric layers so that the outer peripheral portion 330 and the dielectric layers are matched in the shrinkage ratio, thereby allowing for formation of the conductive via without voids or cracks.

Figure 4:
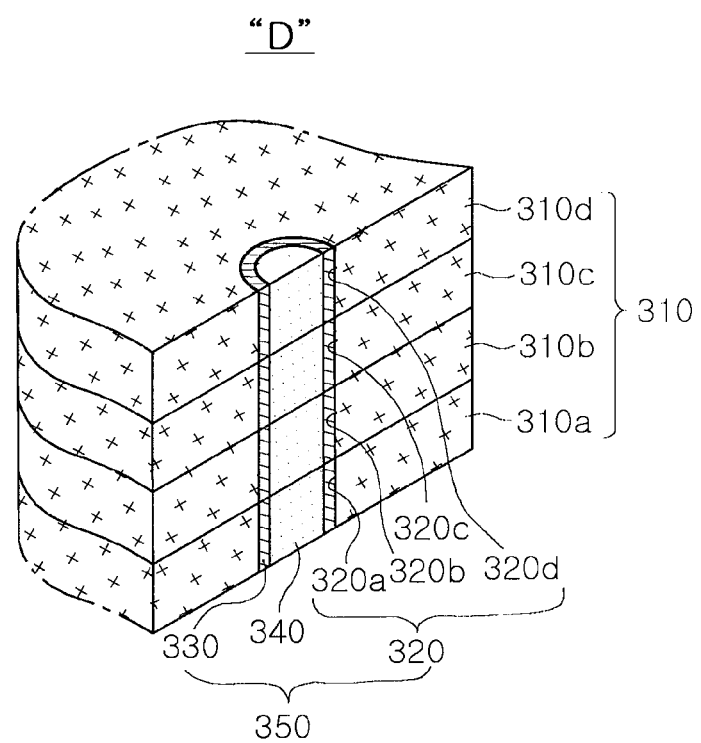
FIG. 4 is a detailed perspective view illustrating a portion (D) in a conductive via of the multilayer ceramic substrate shown in FIG. 3.

FIG. 4 is a detailed perspective view illustrating a portion (D) in a conductive via of the multilayer ceramic substrate shown in FIG. 3. As shown in FIG. 4, to form the conductive via 350, a conductive via formed in each of the dielectric layers 310a to 310d is laminated.

The conductive via includes an outer peripheral portion 330 having a first conductive material formed along each of inner walls 320a to 320d of via holes of the dielectric layers 310a to 310d and an inner peripheral portion 340 filled with a second conductive material. Here, the outer peripheral portion 330 transfers a radio frequency signal and the inner peripheral portion 340 serves to match a sintering shrinkage ratio between the first conductive material and the dielectric layers 310a to 310d during constrained sintering.

As shown in FIGS. 2A and 2B, the outer peripheral portion 330 should have a thickness of at least 0.5 μm since the skin depth thereof is greatly reduced to 0.5 μm or less in a radio frequency (mm wave) band. That is, the outer peripheral portion 330 has a thickness of 0.5% to 10% with respect to an entire radius of the conductive via of the each dielectric layer, in view of the skin depth in a radio frequency band. The outer peripheral portion 330 has a thickness of at least 0.5 μm. For example, when the conductive via has a diameter of 100 μm, the outer peripheral portion 330 has a thickness of 0.5 μm to 10 μm. The outer peripheral portion 330 may have a thickness of 1 to 5 μm.

Also, the first conductive material may be a metal with good electrical conductivity. Particularly, the first conductive material may be Ag metal with highest electrical conductivity. Moreover, the first conductive material is a metal paste having a small amount of additive added thereto. The first conductive material is substantially a high-purity metal. The second conductive material has a shrinkage initiation temperature higher than a shrinkage initiation temperature of the first conductive material. The second conductive material has a shrinkage initiation temperature equivalent to or higher than a shrinkage initiation temperature of the dielectric layer. Moreover, the second conductive material is formed of a metal paste containing a metal identical to the first conductive material and added with a great amount of glass or silicon oxide to ensure matching of the shrinkage ratio with the dielectric layers. The second conductive material has a higher content of silicon oxide ($SiO_2$) and glass than the first conductive material respectively.

As described above, the conductive vias formed in the dielectric layers 310a to 310d, respectively are laminated and then sintered. Here, the outer peripheral portion 330 is filled with a first conductive material containing a great amount of metal and thus initiates shrinking earlier than the dielectric layers. However, the inner peripheral portion 340 formed within the outer peripheral portion 330 is filled with the second conductive material having a shrinkage initiation temperature equivalent to or higher than the dielectric layers. This allows the outer peripheral portion 330 and the dielectric layers to be matched in the shrinkage ratio.

Figure 5:
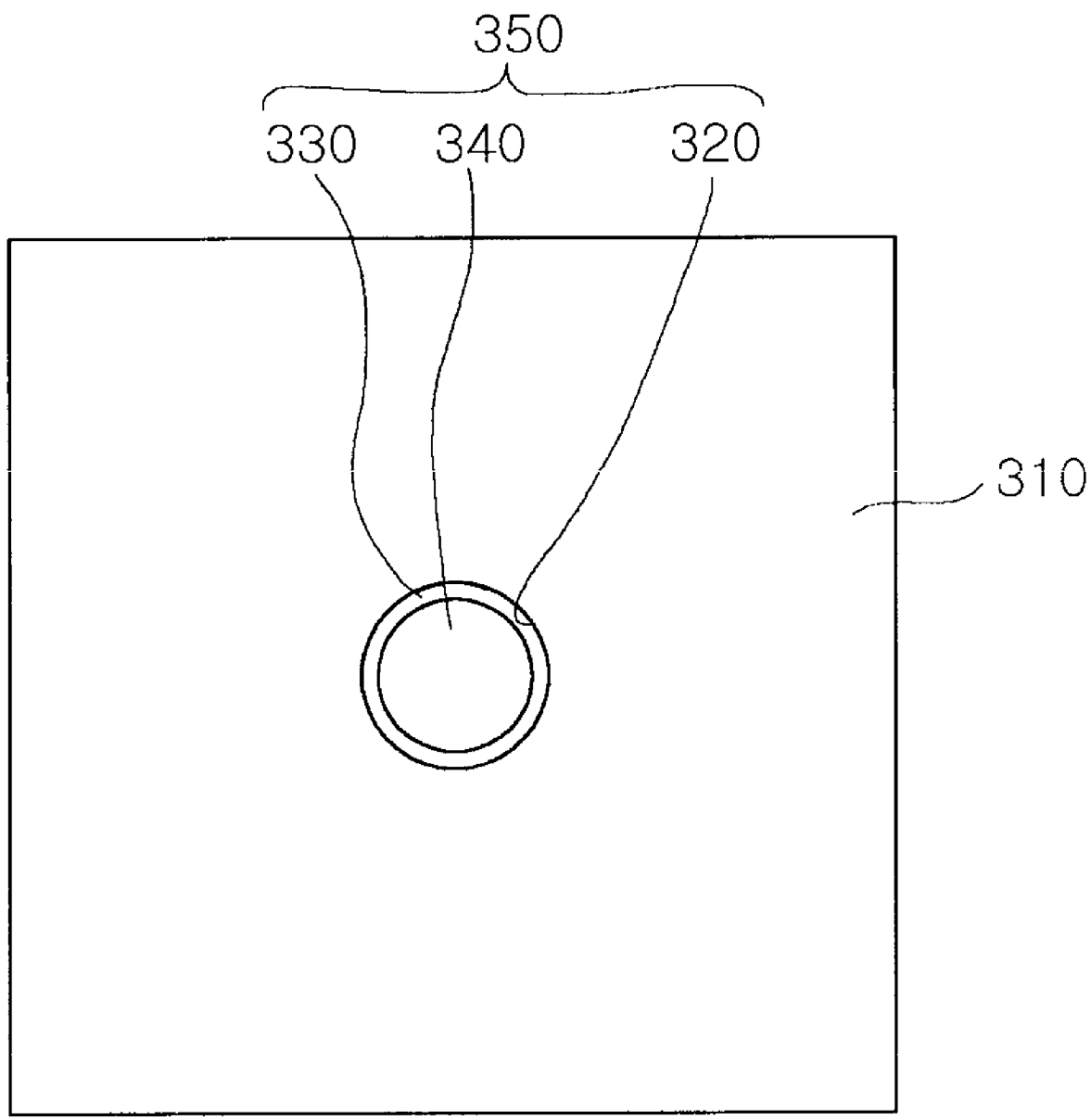
FIG. 5 is a horizontal cross-sectional view illustrating a conductive via of the multilayer ceramic substrate shown in FIG. 3.

FIG. 5 is a horizontal cross-sectional view illustrating a conductive via of the multilayer ceramic substrate shown in FIG. 3. As shown in FIG. 5, the conductive via 350 includes the outer peripheral portion 330 and the inner peripheral portion 340. The outer peripheral portion 330 has a thickness of 0.5% to 10% with respect to an entire radius of the conductive via 350, in view of the skin depth in a radio frequency band. The outer peripheral portion has a thickness of at least 0.5 μm. The outer peripheral portion 330 may have a thickness of 1 to 5 μm.

Figure 6A:
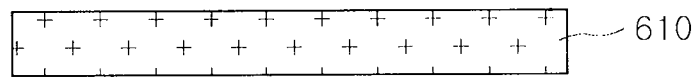
FIGS. 6A to 6F are process-wise vertical cross-sectional views illustrating a method of manufacturing a multilayer ceramic substrate according to an exemplary embodiment of the invention.
Figure 6B:
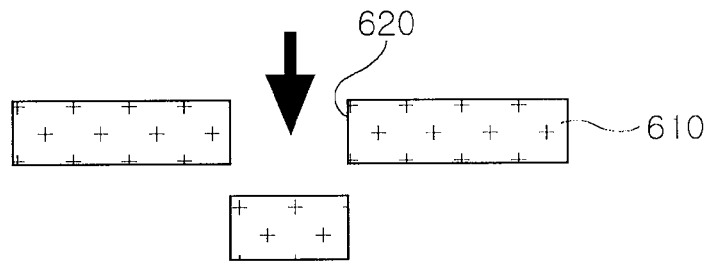

FIGS. 6A to 6F are process-wise vertical cross-sectional views illustrating a method of manufacturing a multilayer ceramic substrate according to an exemplary embodiment of the invention. As shown in FIG. 6A, a plurality of dielectric layers 610 are provided. The dielectric layers are ceramic green sheets for forming a low-temperature co-fired sintering ceramics (LTCC) substrate. Then, as shown in FIG. 6B, a via hole 620 is formed in each of the dielectric layers 610 by punching.

Figure 6C:
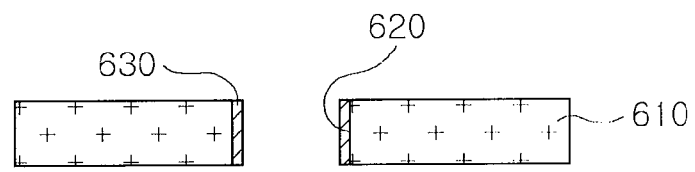

Thereafter, as shown in FIG. 6C, a first conductive material is filled in an inner wall 620 of the via hole formed in the dielectric layer 610 by squeezing. At this time, the first conductive material is filled only in the inner wall 620 of the via hole by performing vacuum-suction below the dielectric layer 610 to thereby form the outer peripheral portion 630. The first conductive material may be a metal with good electrical conductivity. The first conductive material may be Ag metal with highest electrical conductivity. Also, the first conductive material is a metal paste having a small amount of additive added thereto. The first conductive material is a substantially high-purity metal.

Figure 6D:
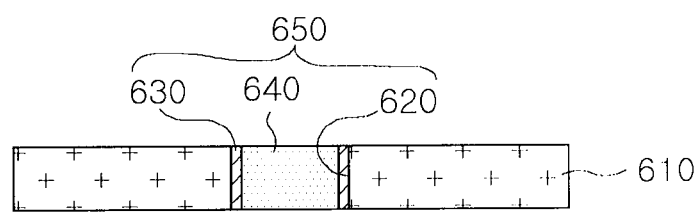

Moreover, as shown in FIG. 6D, the outer peripheral portion 630 is formed on the inner wall 620 of the via hole of the dielectric layer 610 and then the inner peripheral portion 640 is formed inside the outer peripheral portion 630. That is, a second conductive material is filled into the outer peripheral portion 630 of the dielectric layer 610 by squeezing. Here, the second conductive material is filled into the outer peripheral portion 630 by performing vacuum-suction below the dielectric layer 610 to thereby form the inner peripheral portion 640. The second conductive material has a shrinkage initiation temperature higher than a shrinkage initiation temperature of the first conductive material. To be matched in the shrinkage ratio with the first conductive material, the second conductive material is formed of a paste containing a metal identical to the first conductive material and a great amount of glass or silicon oxide added thereto.

Moreover, in forming the outer peripheral portion 630 and inner peripheral portion 640, vacuum-suction is adjusted in intensity to form the outer peripheral portion 630 filled only in the inner wall 630 of the via hole or filled entirely into the outer peripheral portion 630.

Figure 6E:
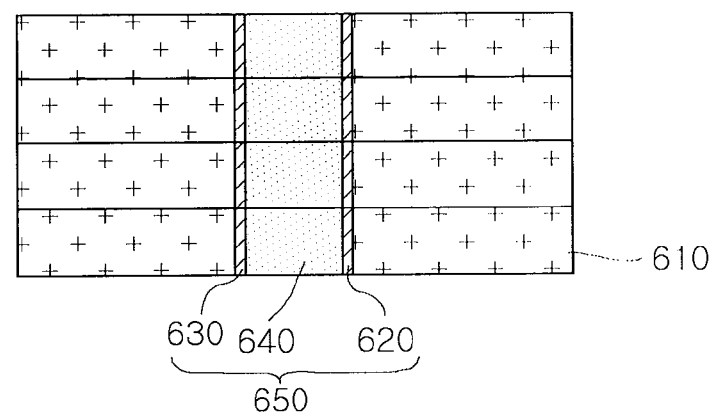

Thereafter, as shown in FIG. 6E, the dielectric layers 610 each having a conductive via of a dual-layer structure including the outer peripheral portion 630 and the inner peripheral portion 640 are laminated. Here, the conductive vias 650 of the dielectric layers 610 are laminated and pressurized to be connected together to thereby form a laminated body.

Figure 6F:
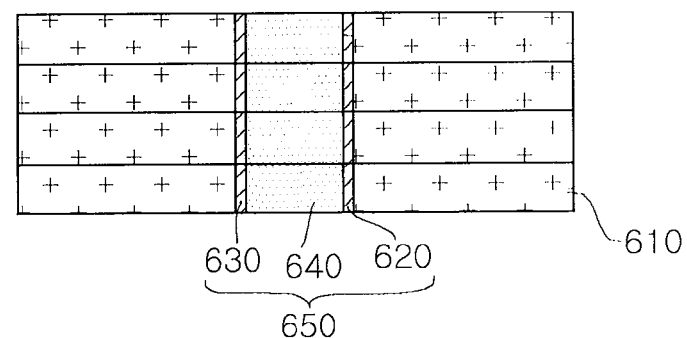

The laminated body formed in this fashion is sintered to complete a multilayer ceramic substrate shrunken in a y axis as shown in FIG. 6F. During sintering, the outer peripheral portion 630 is filled with a first conductive material containing a great amount of metal having a shrinkage initiation temperature lower than a shrinkage initiation temperature of the dielectric layer. However, the inner peripheral portion 640 formed in the outer peripheral portion 630 is filled with a second conductive material having a shrinkage initiation temperature equivalent to or higher than a shrinkage initiation temperature of the dielectric layers. This allows the outer peripheral portion 630 to be matched in the shrinkage ratio with the dielectric layers. Therefore, the outer peripheral portion having a high-purity metal layer is formed in a skin depth area of the conductive via where current is crowded, thereby increasing electrical conductivity in a radio frequency (mm wave) band.

Figure 7:
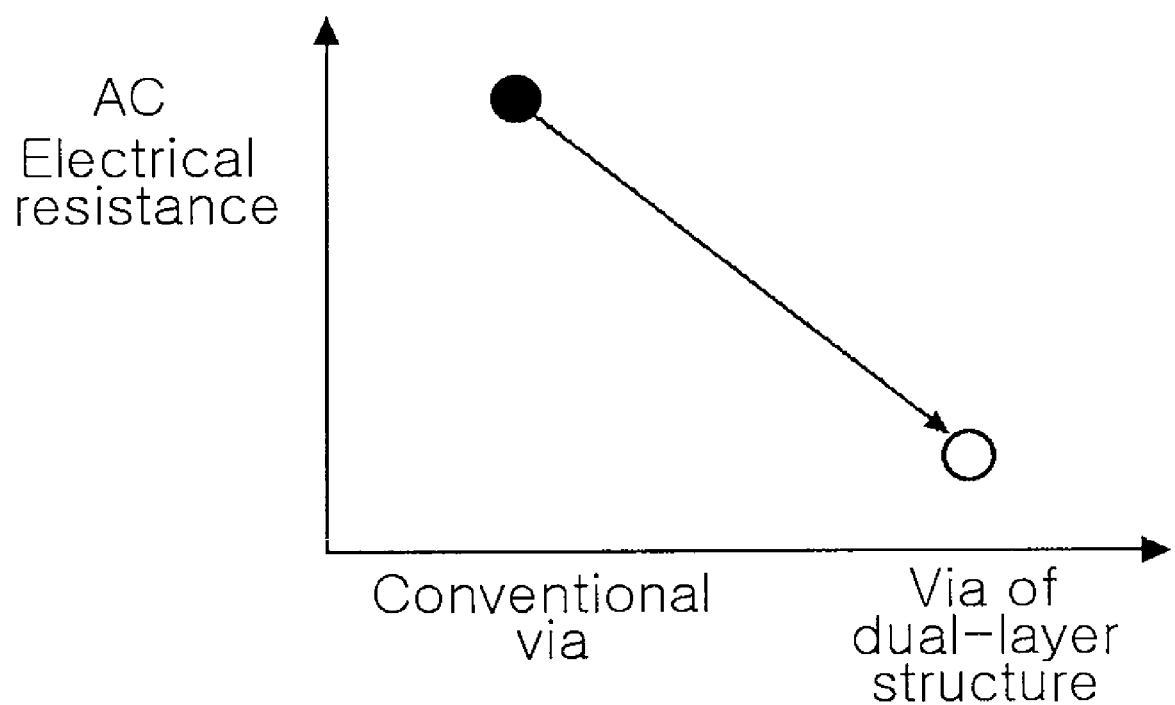
FIG. 7 is a graph illustrating a change in AC electrical resistance in a conductive via of a dual-layer structure of a multilayer ceramic substrate according to an exemplary embodiment of the invention.

FIG. 7 is a graph illustrating a change in AC electrical resistance in a conductive via of a dual-layer structure of a multilayer ceramic substrate according to an exemplary embodiment of the invention. As shown in FIG. 7, a conductive via (white circle) of a dual-layer structure according to an exemplary embodiment of the invention exhibits lower Ac electrical resistance than a via (black circle) filled with a conventional paste having a great amount of glass powder added to an Ag powder, at a radio frequency (mm wave) band.

As set forth above, according to exemplary embodiments of the invention, a conductive via of a dual-layer structure is formed to include an outer peripheral portion made of an Ag metal and an inner peripheral portion made of a material having a shrinkage initiation temperature equivalent to or higher than a dielectric layer of a substrate. This allows AC electric resistance of a conductive via in a radio frequency band to be reduced to a level of pure Ag, thereby preventing signal loss in a radio frequency (mm wave) band.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer ceramic substrate comprising:
a plurality of dielectric layers; and a circuit pattern part disposed on at least a portion of the dielectric layers, the circuit pattern part including at least one conductive via and conductive pattern, wherein the at least one conductive via comprises an outer peripheral portion and an inner peripheral portion, the outer peripheral portion being disposed along an inner wall of a via hole extending through the dielectric layers and being of a first conductive material containing a metal and at least one of silicon oxide ($SiO_2$) and glass, and the inner peripheral portion being filled inside the outer peripheral portion and being of a second conductive material having more silicon oxide ($SiO_2$) or glass than that of the first conductive material so as to have a shrinkage initiation temperature higher than a shrinkage initiation temperature of the first conductive material and equal to or higher than a shrinkage initiation temperature of the dielectric layers.

2. The multilayer ceramic substrate of claim 1, wherein the metal in the first conductive material is Ag metal.

3. The multilayer ceramic substrate of claim 1, wherein the outer peripheral portion has a thickness that is 10% or less with respect to an entire radius of the conductive via.

4. The multilayer ceramic substrate of claim 3, wherein the outer peripheral portion has a thickness that is 0.5% or more with respect to an entire radius of the conductive via.

* * * * *